United States Patent [19]
Takahashi et al.

[11] Patent Number: 5,498,978
[45] Date of Patent: Mar. 12, 1996

[54] FIELD PROGRAMMABLE GATE ARRAY

[75] Inventors: Makoto Takahashi, Yokohama; Fumitoshi Hatori, Tachikawa; Kazutaka Nogami, Palo Alto; Masanori Uchida, Chino, all of Japan

[73] Assignee: Kabushiki Kaisha Toshiba, Kanagawa, Japan

[21] Appl. No.: 237,851

[22] Filed: May 4, 1994

[30] Foreign Application Priority Data

May 7, 1993 [JP] Japan .................................. 5-106999

[51] Int. Cl.$^6$ ......................... H01H 37/76; H03K 17/687
[52] U.S. Cl. ................................. 326/38; 326/41; 326/44; 327/525
[58] Field of Search .................................. 326/38, 41, 44; 327/525

[56] References Cited

U.S. PATENT DOCUMENTS

| | | | |
|---|---|---|---|
| 5,015,885 | 5/1991 | El Gamal et al. | 326/38 |
| 5,130,777 | 7/1992 | Galbraith et al. | 357/51 |
| 5,223,792 | 6/1993 | El-Ayat et al. | 326/44 |
| 5,341,030 | 8/1994 | Galbraith | 326/38 |
| 5,371,414 | 12/1994 | Galbraith | 327/525 |

FOREIGN PATENT DOCUMENTS

| | | |
|---|---|---|
| 489570 | 6/1992 | European Pat. Off. |
| 493937 | 7/1992 | European Pat. Off. |
| 493957 | 7/1992 | European Pat. Off. |
| 9303497 | 2/1993 | WIPO |

OTHER PUBLICATIONS

Mike Ahrens, et al., "An FPGA Family Optimized for High Densities and Reduced Routing Delay", IEEE 1990 Custom Integrated Circuits Conference.

*Primary Examiner*—Edward P. Westin
*Assistant Examiner*—Richard Roseen
*Attorney, Agent, or Firm*—Loeb and Loeb

[57] ABSTRACT

A field programmable gate array comprises: a first wiring group composed of a plurality of first wirings (C1, C2, C3, . . . ); a second wiring group composed of a plurality of second wirings (R1, R2, R3, . . . ); a plurality of programmable elements (A11, A12, A13, . . . ) arranged into an array pattern at at least one of plural intersections between the first wirings and the second wirings, each of the programmable element being connected to each of the first wirings (C1, C2, C3, . . . ) at one end thereof and to each of the second wirings (R1, R2, R3, . . . ) at the other end thereof and being programmed by a programming voltage applied between the first wiring and second wiring to switch connection between the first and second wirings to disconnection between the two wirings or vice versa; and voltage supplying sections (CD1, RD1) for applying a programming voltage between the first and second wirings (C1, C2, C3, . . . ; R1, R2, R3, . . . ) between which the programmable element to be programmed is connected and an intermediate voltage between the first and second wirings between which the programmable element not to be programmed is connected, the intermediate voltage being lower than the programming voltage to such an extent as not to affect state of the programmable elements (A11, A12, A13, . . . ).

8 Claims, 18 Drawing Sheets

FIG. 7

||  ||

F:KEPT AT FLOAT STATUS AFT PRECHG TO $V_{pp}/2$

FIELD PROGRAMMABLE GATE ARRAY

FIELD OF THE INVENTION

The present invention relates to a field programmable gate array (FPGA).

BACKGROUND OF THE INVENTION

The circuits using a programmable array have been developed as ASIC (application specified ICs), that is, as small-quantity products or trial products. Conventionally, the typical circuits using the programmable array are GAs (gate arrays) and SCs (standard cells) customized from the mask level so as to satisfy the specifications required by the user, or PLAs (programmable logic arrays) customized by the user itself. In the case of the SCs, logic circuit blocks used in an LSI (Large Scale Integration) are previously registered in a computer, and products required by the user are designed by arranging and connecting these logic circuit blocks through the automatic processing by use of the computer. Further, in the case of the GAs, basic circuits for constituting logic gates are previously formed into an array pattern on a semiconductor substrate, and the user manufactures any desired LSI by deciding the wiring pattern using an automatic wiring. Software in the same way as with the case of the standard cells. The above-mentioned methods have such advantages that the period required for development is relatively short, as compared with the ordinary LSI which is totally designed from the beginning. In these methods, however, there still exists a problem in that it takes several weeks or several months from the design end to the production completion, because the manufacturing process is still required after the user has finished the design. In other words, in the case of the GAs and SCs, although there exists such an advantage that any required circuits can be realized, a long development period is needed and thereby the development cost is relatively higher than that of the PLAs. In contrast with this, in the case of the PLAs, although the cost is low and the development period is short, there exists a limit in the actually realizable circuits.

To overcome the shortcomings involved in both the circuit devices, recently, a circuit device referred to as FPGA (field programmable gate array) has been developed, by which any given circuits (as with the case of the GAs) can be developed by the user (as with the case of the PLAs). In this FPGA, there are previously arranged basic cells (each composed of a single of or a plurality of transistors), interconnections for connecting these basic cells, and programmable elements, so that any desired circuits can be obtained by the user by programming these programmable elements. As this circuit device, various devices provided with different programmable elements and different basic cells are now being developed.

Here, the FPGA which uses anti-fuses as one example of the above-mentioned programmable elements will be explained hereinbelow, in which the anti-fuses are arranged at the intersections between the crosswise arranged wires connected to logic blocks so that the interconnections can be connected to or disconnected from each other.

FIG. 1 shows the FPGA using anti-fuses A as the programmable elements. When any desired anti-fuses A are selectively programmed, it is possible to obtain any desired logic circuit. The respective anti-fuses A are provided at the intersections between a group LG1 of first wires C arranged in the vertical direction and a group LG2 of second wires R arranged in the horizontal direction, respectively. The first and second wires C and R intersect each other in three dimensions. These wire groups are referred to as wiring resources sometimes hereinbelow. Under non-programmed conditions, the first and second wires are disconnected from each other by the respective anti-fuses A as shown in FIG. 2(a). Under programmed conditions, on the other hand, the first and second wires are connected to each other by the respective anti-fuses A as shown in FIG. 2(b). When an anti-fuse A is not yet programmed, the white circle (NP) as shown in FIG. 1(a) is used; and when an anti-fuse A is programmed, the black circles (P) as shown in FIG. 1(b) is used, hereinafter.

FIGS. 3(a) to (c) show only the anti-fuses existing at the respective intersections between the wire groups (in which the logic blocks LB are omitted) for assistance in explaining the programming procedure. When the anti-fuse A22 is required to be programmed under the non-programmed conditions as shown in FIG. 3(a), a programming potential VPP is applied to the wire C2; a ground potential GND is applied to the wires R2; and an intermediate potential VPP/2 is applied to the other wires, respectively as shown in FIG. 3(b). In this case, since the potential not high enough to program the anti-fuses is applied across the non-selected anti-fuses but the potential high enough to program the anti-fuse is applied across the selected anti-fuse A22, it is possible to selectively program the selected anti-fuse A22. Successively, when the anti-fuse A21 is required to be programmed as shown in FIG. 3(c), the programming potential VPP is applied to the wire C1; the ground potential GND is applied to the wire R2; and the intermediate potential VPP/2 is applied to the other wires, respectively. In this case, however, an excessive current flows from the intermediate potential to the ground potential through the programmed anti-fuse A22 (for connecting the wires R2 and C2). This current increases in proportion to the number of the programmed anti-fuses. Consequently, in the conventional FPGA using the anti-fuses, there exist problems in that the current consumption is large during the programming stage and thereby the desired potentials are not applied to the wire groups, with the result that the selected anti-fuses cannot be programmed.

FIG. 8 shows the output portions of a plurality of the logic blocks having common input terminals G1 and G2 (or so programmed), and FIG. 9 shows the same circuit obtained when the respective logic blocks LB1 to LB6 are shown by use of MIL symbols. In FIG. 8, V1 and V2 are wires to which the supply potential and the ground potential are applied, respectively after having programmed. However, during the programming, these wires must be kept at a floating potential. The reason is as follows: in the logic blocks LB1, LB3, LB4 and LB6, since at least one of P-type and N-type field effect transistors for constituting the output portion is turned on irrespective of the potentials at the input terminals G1 and G2, there exists a possibility that the potentials applied to the wires R1, R3, R4 and R6 for programming are shorted to the supply potential or the ground potential so that the current consumption increases or the anti-fuses cannot be programmed normally.

Here, when the wires R1 and C2 are required to be connected to each other, as shown in FIG. 10 the ground potential GND is applied to the wire R1; the program potential VPP is applied to the wire C2; and an intermediate potential VPP/2 is applied to the other wires, respectively to break-down the insulation of the anti-fuse A12 for shorting the wires R1 and C2. Further, when the anti-fuse A62 is required to be programmed, as shown in FIG. 11 the program potential VPP is applied to the wire C2; the ground potential GND is applied to the R6; and the intermediate potential is applied to the other wires. In this case, however, there exist the following problems: since the anti-fuse A12 has been already shorted, the potential VPP is applied to both the wires R1 and C2, so that this potential VPP is outputted to the wire R6 through the wire V1 or V2 (because at least one of P-type and N-type field effect transistors for constituting the output portion is turned on irrespective of the potentials at the input terminals G1). In this case, however, since another ground potential GND is applied to the wire R6 separately, the programming potential VPP is shorted to the ground potential GND so that an excessive current flows. Further, in the worst case, the necessary programming potentials are not applied across the anti-fuse A62, so that it is impossible to program the programmable elements. To overcome this problem, the following restriction is required: the logic blocks having the common input terminals cannot be used; or the outputs of the logic blocks must be programmed before the inputs of the logic blocks are programmed for connecting, thus arising another problem in that the circuit constitution and the program procedure are both restricted.

In addition, in the above-mentioned FPGA LSI, since the internal wires are not connected to one another before programmed, in case some defects (e.g., disconnection between the wires, short-circuits to other portions, etc.) occur in the LSI, there exists a possibility that the circuit will not operate normally in accordance with the user's design, in spite of the fact that the program procedure has been completed properly. As a result, in the conventional FPGA LSI, it has been indispensable to test the presence or absence of the disconnections and short-circuits of the wiring resources from and to other portions, before shipping, to omit the defective products. In the case of the above-mentioned test, since voltage must be applied to one end of each of all the wires to measure current flowing from one end to the other end of all the wires; or else since the potential must be applied between the wires to be tested and the other wires adjacent to or crossing the wire to be tested for current measurement, there exists another problem in that it takes a long test time (since the current must be measured by an external instrument) and thereby the manufacturing cost thereof is high.

In summary, in the conventional FPGA using the anti-fuses, there exist such drawbacks that when the anti-fuses are required to be programmed after some anti-fuses have been programmed, the current consumption increases; erroneous programming occurs; the circuit must be constituted under due consideration of the influence of the programmed anti-fuses; and the program procedure must be restricted. In addition, there exists a problem in that the programmed circuit cannot be realized for some the circuits designed by the user, and a long test time is required to test the disconnection or the short-circuit of the wiring resources.

SUMMARY OF THE INVENTION

With these problems in mind, therefore, it is the object of the present invention to provide FPGA (field programmable gate array) by which the programmable elements arranged into a matrix pattern can be programmed; the anti-fuses can be programmed without being subjected to the influence of the anti-fuses already programmed; the current consumption during the programming procedure can be reduced; the restriction on the logic blocks and the program procedure can be eliminated; and the test for the wiring resources can be effected at high speed.

To achieve the above-mentioned object, the present invention provides a field programmable gate array, comprising: a first wire group composed of a plurality of first wires; a second wire group composed of a plurality of second wires; a plurality of programmable elements arranged into an array pattern at at least one of plural intersections between the first wires and the second wires, each of said programmable element being connected to each of the first wires at one end thereof and to each of the second wires at the other end thereof and being programmed by a programming voltage applied between the first wire and second wire to switch connection between the first and second wires to disconnection between the two wires or vice versa; and voltage supplying means for applying a programming voltage between the first and second wires between which said programmable element to be programmed is connected and an intermediate voltage between the first and second wires between which said programmable element not to be programmed is connected, the intermediate voltage being lower than the programming voltage to such an extent as not to affect state of said programmable elements. Further, the present invention provides a field programmable gate array, comprising: a first wire group composed of a plurality of first wires; a second wire group composed of a plurality of second wires; a plurality of switching means arranged at at least one of plural intersections between the first wires and the second wires, each of said switching means being connected to each of the first wires at one end thereof and to each of the second wires at the other end thereof to selectively connect or disconnect the first wire to or from the second wire on the basis of a programming voltage applied between both ends of said switching means; a plurality of circuit blocks each having at least one input terminal and at least one output terminal, at least one of the output terminals thereof being connected to any of the first wires; and a plurality of disconnecting means each for disconnecting the output terminal of each of said circuit blocks from at least one of a supply voltage line and a ground line, irrespective of input terminal voltage, when said switching means are being programmed.

Further, the present invention provides a field programmable gate array, comprising: first voltage supplying means connected to one end of a wire to be tested, for supplying a high voltage or a low voltage; second voltage supplying means for supplying a voltage opposite to that of said first voltage supplying means to the same wire; and discriminating means connected to the other end of the wire to be tested, for discriminating whether a voltage applied to the other end of the wire is the voltage applied by said first voltage supplying means.

In the field programmable gate array according to the present invention, a programming voltage is applied between the first and second wires connected to the programmable elements to be programmed, and a voltage lower than the programming voltage is applied between the first and second wires connected to the programmable elements not to be programmed. Since the first and second wires connected to the programming elements not to be programmed are kept at the floating status, it is possible to prevent the supply voltages from being shorted through the programmable elements already programmed.

Further, in the present invention, since the output lines of the logic blocks (to which the programmable elements are connected) are disconnected from the supply lines, it is possible to eliminate any restriction on the logic blocks and the program procedure.

Further, in the present invention, it is possible to test the wiring resources at a high speed.

DETAILED DESCRIPTION OF THE PREFERRED EMBODIMENTS

Figure 1:
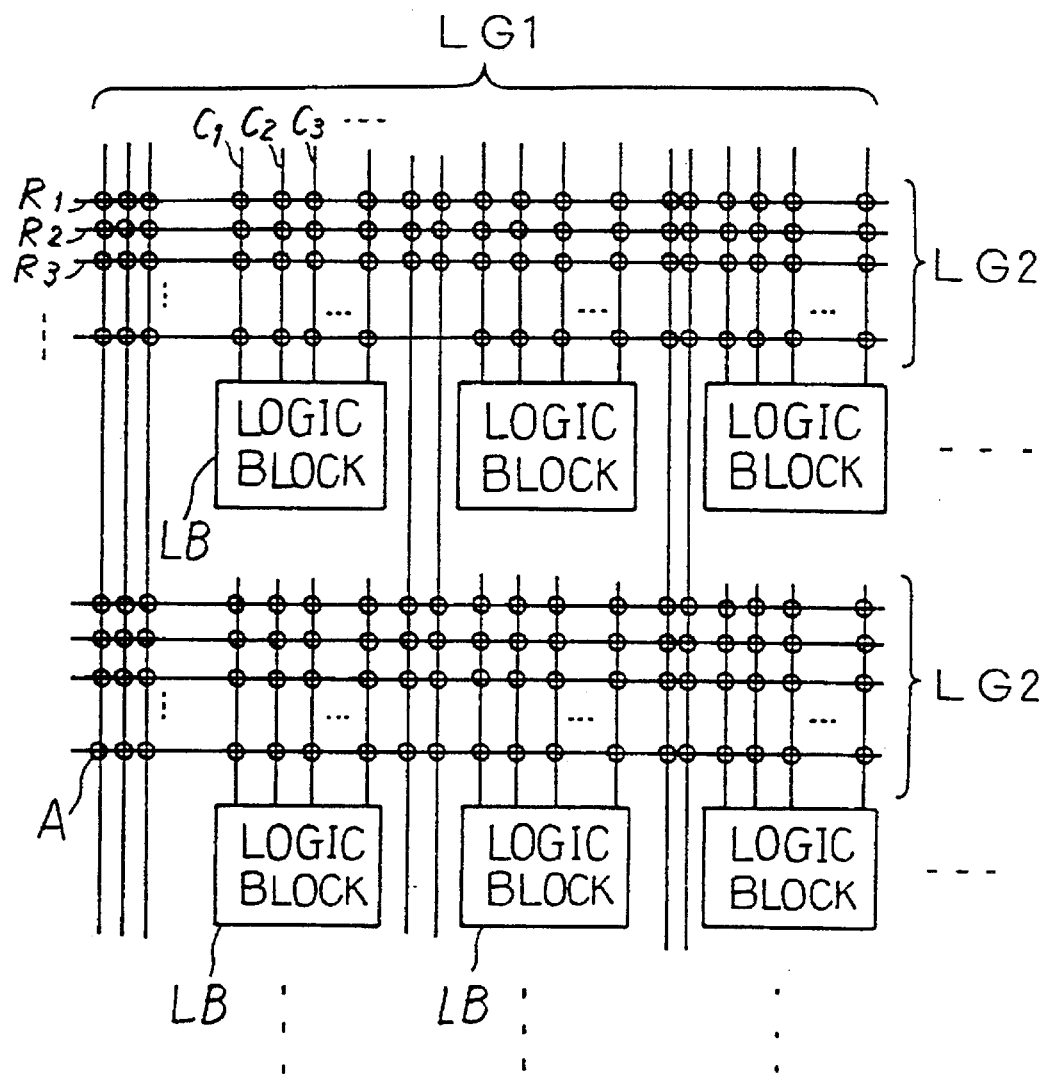
FIG. 1 is a circuit diagram showing a conventional FPGA using anti-fuses as the programmable elements.
Figure 2:
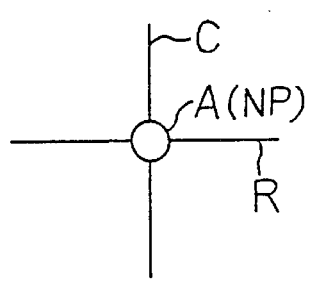
FIGS. 2(a) and 2(b) are illustrations for assistance in explaining the characteristics of the anti-fuse.
Figure 2:
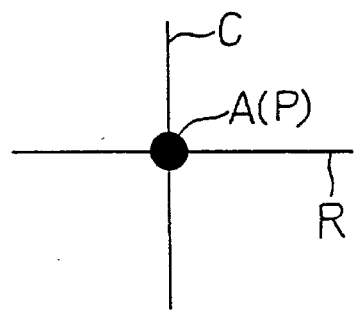
Figure 2:
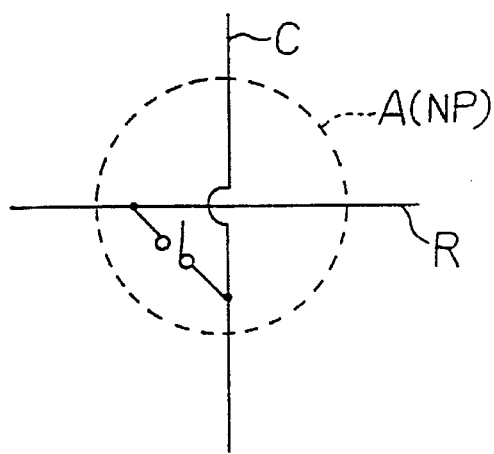
Figure 2:
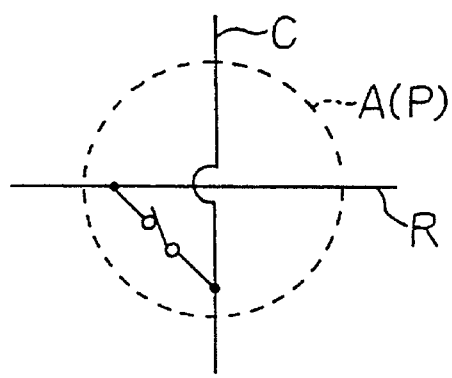
Figure 3:
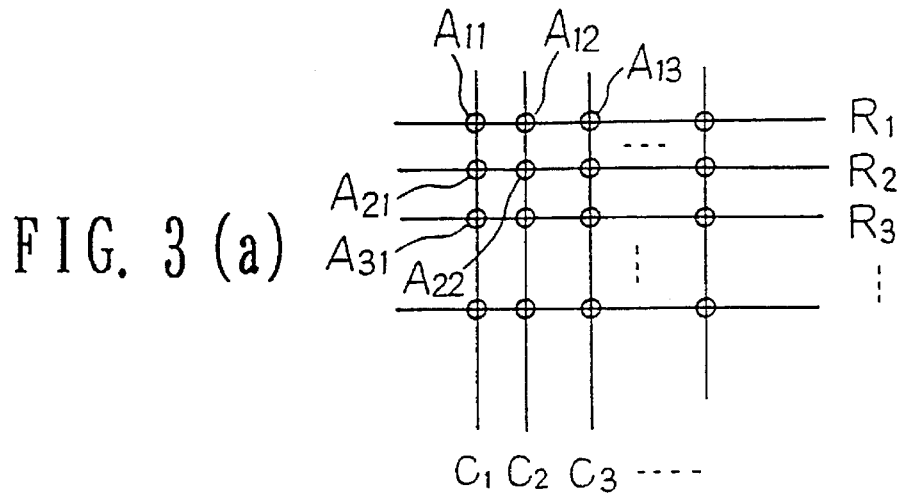
FIGS. 3(a) to 3(c) are diagram showing the relationships between the anti-fuses and the wire groups and the programming sequence.
Figure 3:
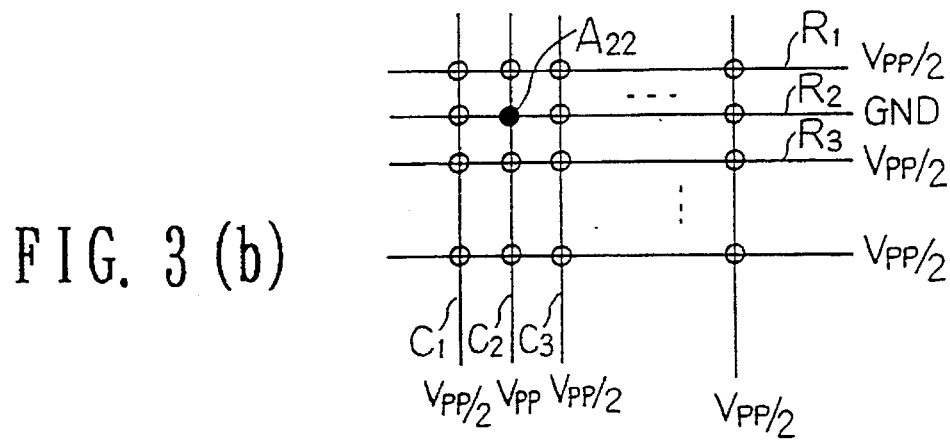
Figure 3:
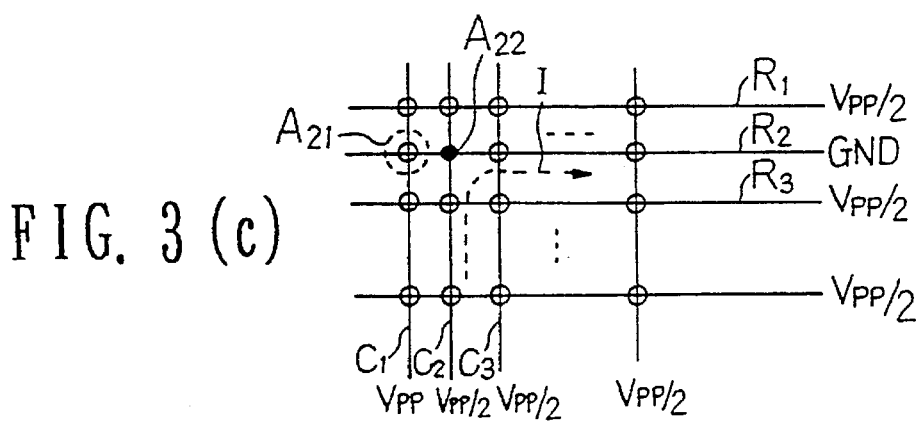
Figure 4:
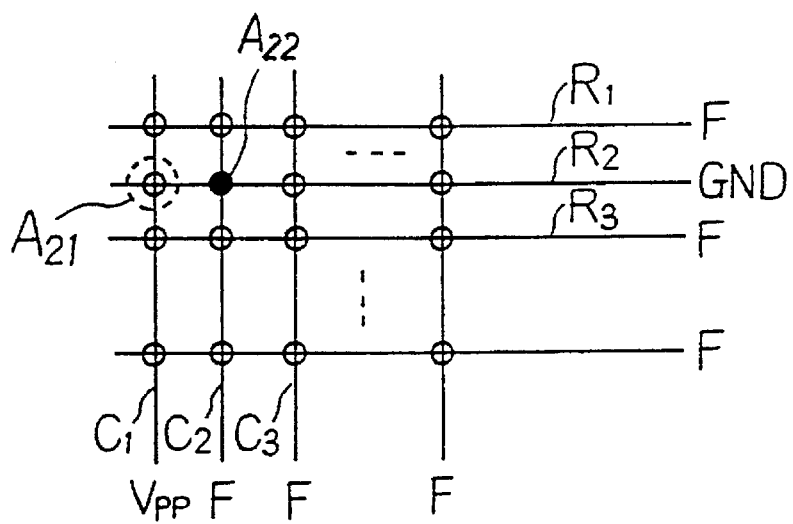
FIG. 4 is a diagram showing a first embodiment of the FPGA according to the present invention.

A first embodiment of the FPGA (field programmable gate array) according to the present invention will be described hereinbelow with reference to FIG. 4. In FIG. 4, the potentials required to program the anti-fuse A21 are shown under the condition that an anti-fuse A22 has been already programmed. Further, the letter F in this figure indicates a floating status kept after an intermediate potential has been applied to the wire or wiring. Accordingly, the potential at the wire or wiring C2 shorted to the wire or wiring R2 by the anti-fuse A22 is set to the ground potential GND, so that it is possible to prevent the short circuit between the intermediate potential and the ground potential (which is different from the conventional case shown in FIG. 3(c)). As a result, it is possible to reduce the power consumption during the programming and to apply the programming potential securely across the anti-fuse A21 for effecting proper programming.

FIGS. 5(a) and (b) show an example of the circuit for realizing the potential status shown in FIG. 4 and the potentials obtained during the programming. One end of each wire R1, R2, R3, ... is connected to each n-type field effect transistor Trn1, Trn2, Trn3, ... each having each gate Gn1, Gn2, Gn3, ..., respectively. On the other hand, the end of each wire C1, C2, C3, ... is connected to each p-type field effect transistor Trp1, Trp2, Trp3, ... each having each gate Gp1, Gp2, Gp3, ..., respectively. FIGS. 5(a) and (b) show the status where the anti-fuse A22 has been already programmed, in which FIG. 5(a) shows the first stage of the programming potential and FIG. 5(b) shows the second stage of the programming potential. In FIG. 5(a), an intermediate potential (about Vpp/2) is applied to the drain terminals of the transistors Trn1, Trn2, Trn3, ... and Trp1, Trp2, Trp3 (on the sides not connected to the wires, respectively); a program potential Vpp is applied to the gate terminals Gn1, Gn2, Gn3, ... ; and a ground potential GND is applied to the gate terminals Gp1, Gp2, Gp3, ..., respectively, so that the intermediate potential is applied to all the wiring resources. Successively, as shown in FIG. 5(b), the ground potential GND is applied to the drain terminal of the transistor Trn2 connected to the wire R2, and the program potential Vpp is applied to the drain terminal of the transistor Trp1 connected to the wire C1. Here, the wires R2 and C2 intersect each other at the anti-fuse A21. Further, the intermediate potential is applied to the drain terminals of the other field effect transistors (on the sides not connected to the wires), respectively. Further, the programming potential Vpp is applied to the gate terminal Gn2 of the transistor Trn2, and the ground potential GND is applied to the gate terminals of the other n-type field effect transistors, respectively. Further, the ground potential Vpp is applied to the gate terminal Gp2 of the transistor Trp2, and the program potential Vpp is applied to the gate terminals of the other p-type field effect transistors, respectively. Under these potential conditions, the transistors Trn2 and Trp1 are turned on, and the other remaining transistors are all turned off, so that the wire R2 is at the ground potential GND; the wire C2 is at the program potential Vpp; the other remaining wires not shorted to the wires R2 and C1 by the already-programmed anti-fuse A21 are kept at the intermediate potential or the floating status. Therefore, since the program potential Vpp can be applied to the anti-fuse A21 required to be programmed, it is possible to program the anti-fuse A21. On the other hand, although the anti-fuse A22 has already been programmed, since the wire C2 is kept at the floating status, no short current flows from the wire C2 to the wire R2 (GND potential), with the result that it is possible to obtained the potential conditions as shown in FIG. 4, thus allowing the anti-fuse A21 to be programmed normally.

FIGS. 6(a) and (b) show the potential status required when the anti-fuse A31 is further programmed, at two different potential stages. In more detail, the potentials are applied to the respective terminals as shown in FIG. 6(a), and the intermediate potential Vpp/2 is applied to the respective wires C1, C2, ..; R1, R2, ..., respectively for precharging. Thereafter, the potentials are applied to the respective terminals as shown in FIG. 6(b), so that the program potential can be applied to the anti-fuse A31 to be programmed. That is, the program potential Vpp is applied to the wire C1, and the ground potential GND is applied to the wire R3, respectively. Further, the other remaining wires not shorted to the wires R3 and C1 by the already-programmed anti-fuses are kept at the intermediate potential Vpp/2 or the floating status. Accordingly, no short current flows between the wire R3 (GND potential) and the intermediate potential and between the wire C2 (the program potential Vpp) and the intermediate potential, with the result that it is possible to correctly program the third anti-fuse A31.

Figure 5:
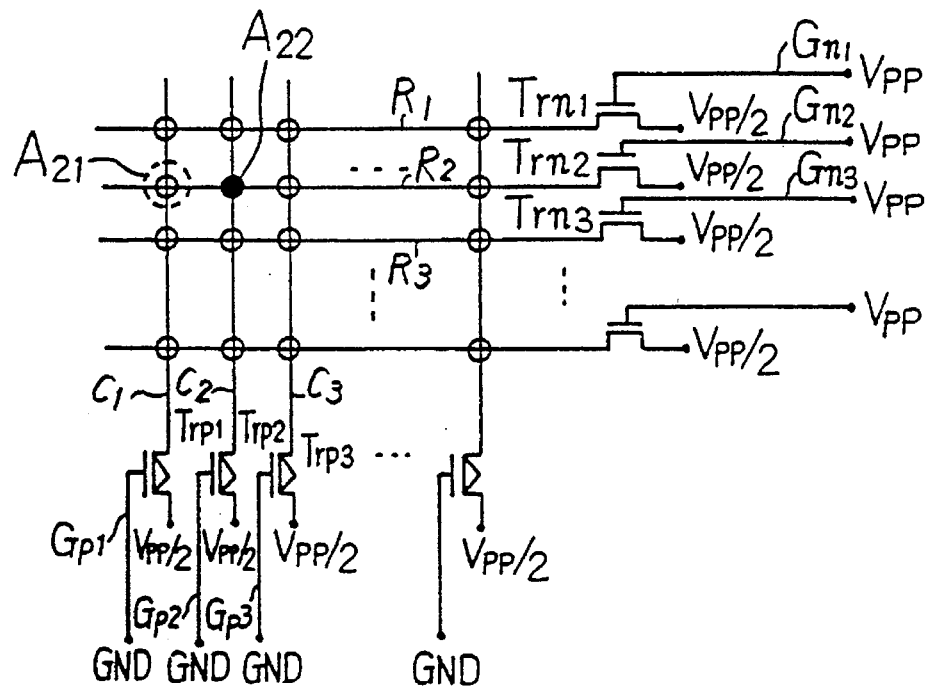
FIGS. 5(a) and 5(b) are circuit examples for realizing the potential status shown in FIG. 4 and the potential examples thereof during the programming.
Figure 5:
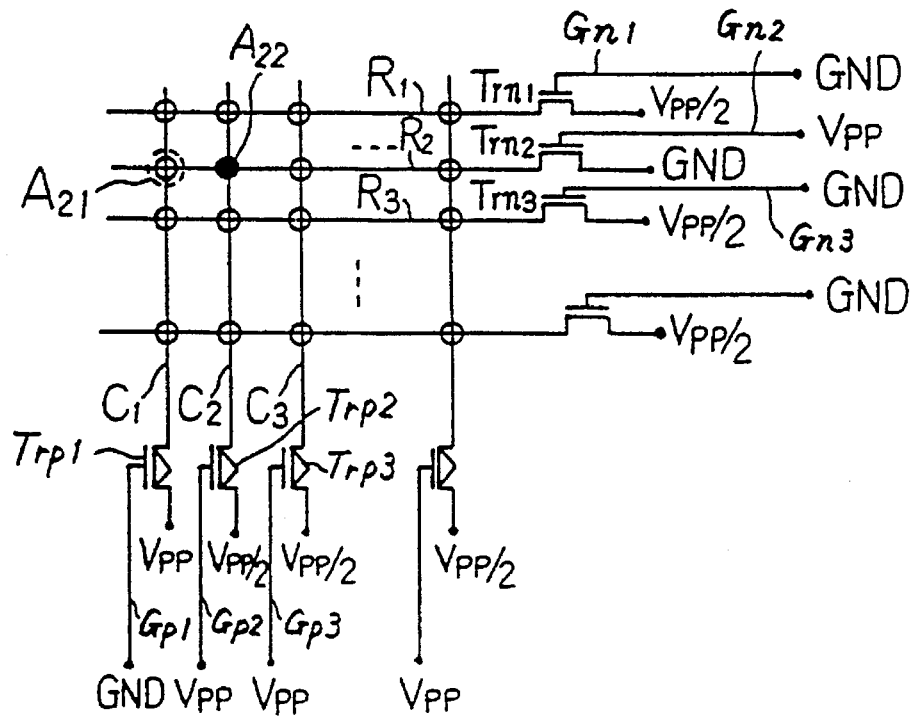
Figure 6:
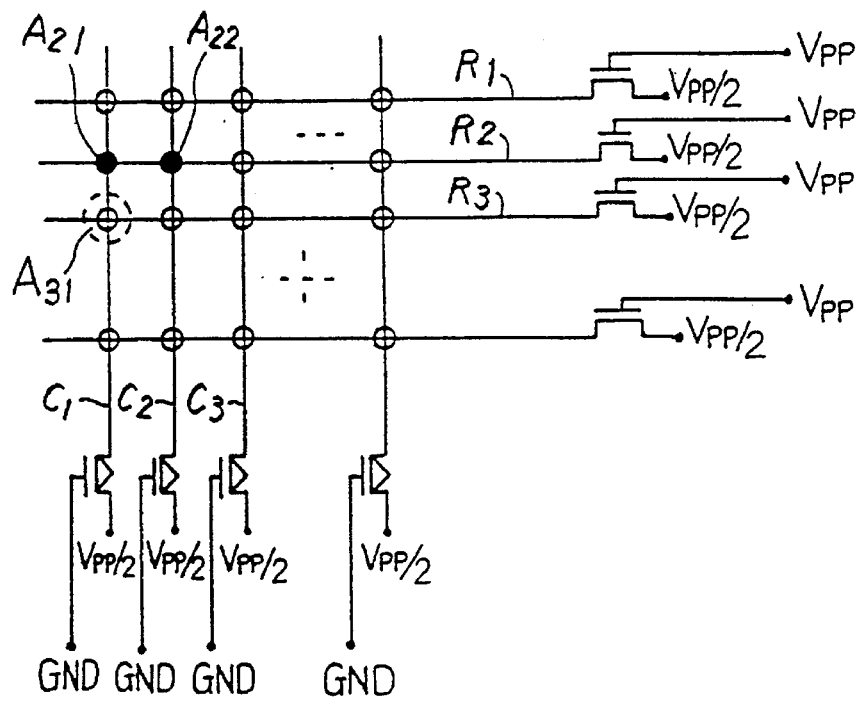
FIGS. 6(a) and 6(b) are other circuit examples for realizing the potential status shown in FIG. 4 and the potential examples thereof during the programming.
Figure 6:
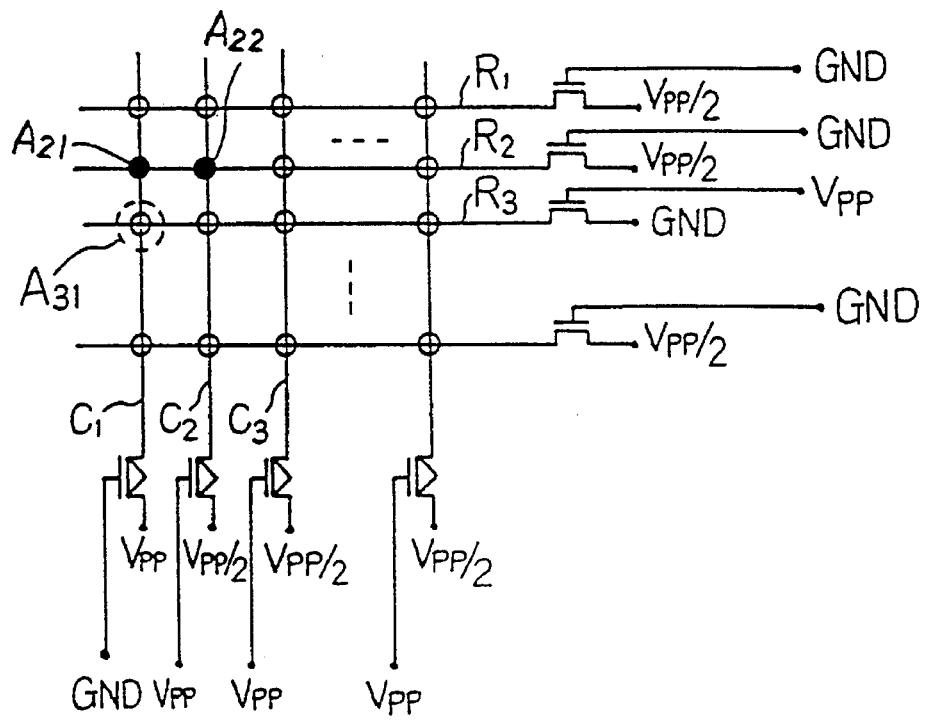
Figure 7:
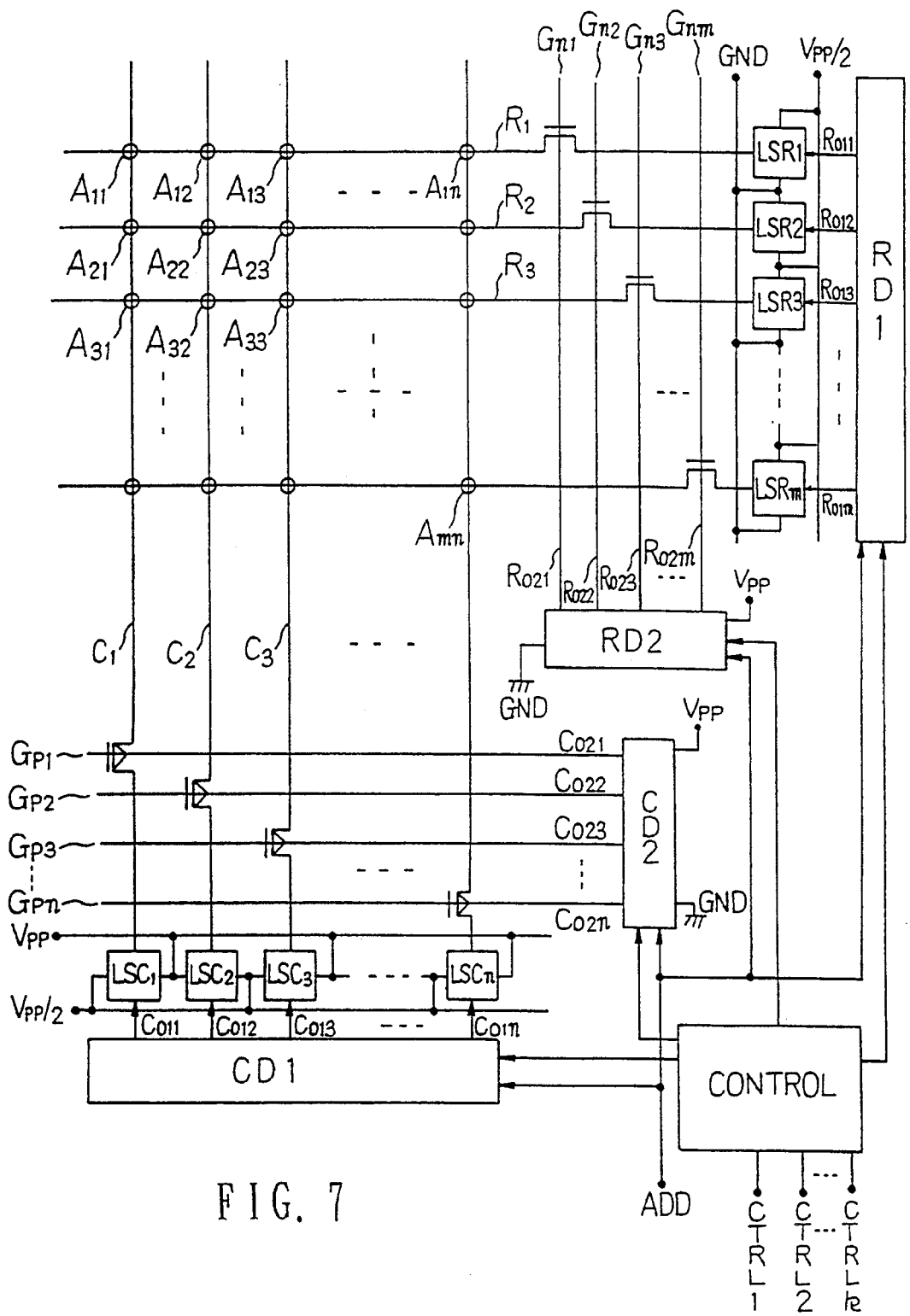
FIG. 7 is a further more practical circuit example of the first embodiment shown in FIG. 4.
Figure 8:
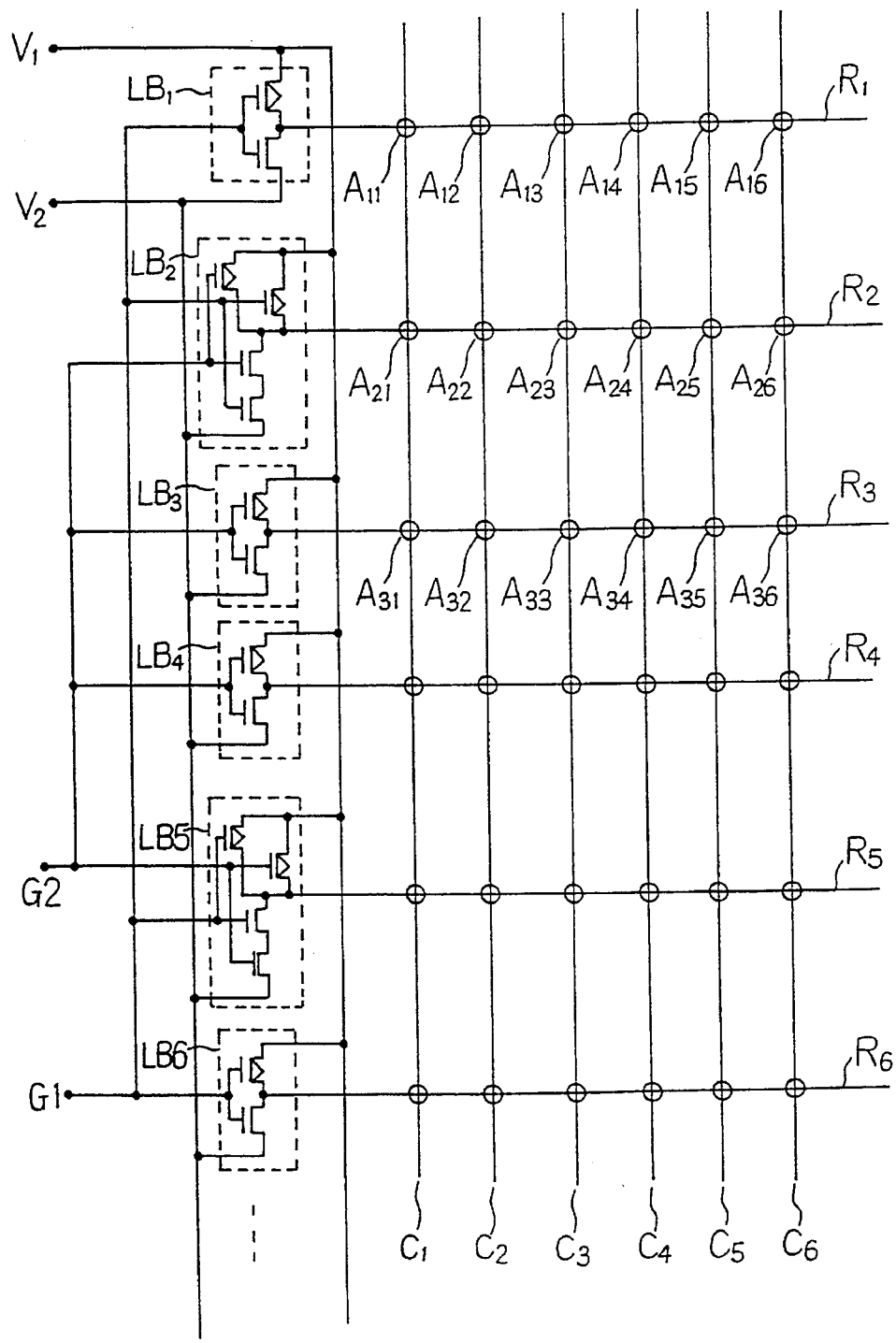
FIG. 8 is a circuit diagram showing output portions of a plurality of the logic blocks.
Figure 9:
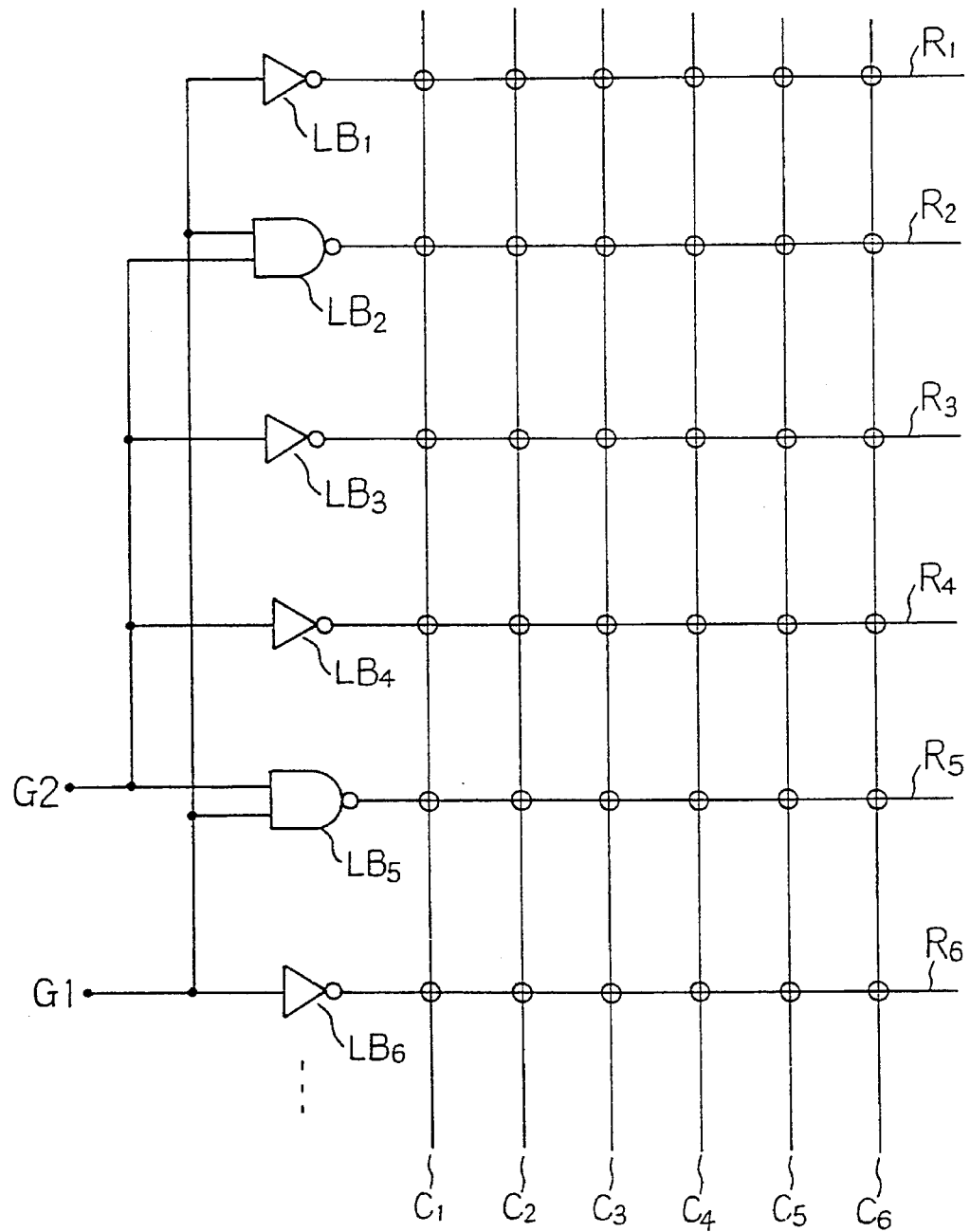
FIG. 9 is a circuit diagram showing the logic blocks shown in FIG. 8 by use of MIL symbols.
Figure 10:
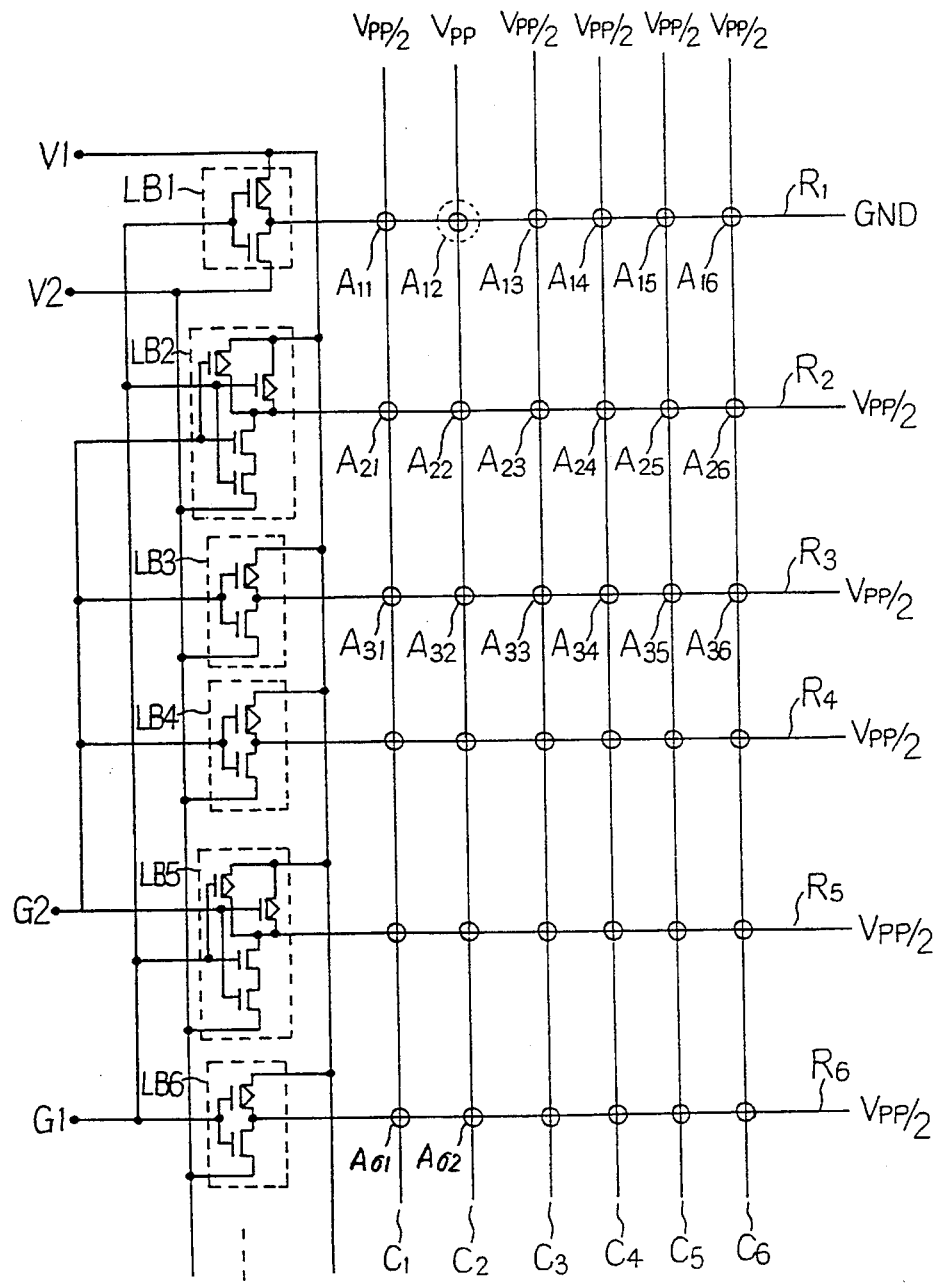
FIG. 10 is a circuit diagram showing the potential application conditions for connecting the wires R1 and C2.

FIG. 7 is an example of more practical circuit of the first embodiment of the present invention. In FIG. 7, row decoders RD1 and RD2 control the level selecting circuits LSR1, LSR2, LSR3, ... LSRm and the gate terminals Gn1, Gn2, Gn3, ... Gnm of the field effect transistors connected to the wiring resources, in accordance with the control signals supplied by a control circuit CONT and address data, respectively. In the same way, column decoders CD1 and CD2 control the level selecting circuits LSC1, LSC2, LSC3, ... LSCm and the gate terminals Gp1, Gp2, Gp3, ... Gpm of the field effect transistors connected to the wiring resources, in accordance with the control signals supplied by the control circuit CONT and address data, respectively. Accordingly, it is possible to apply the potentials as shown in FIG. 5 and 6 to the wires connected across the selected anti-fuses. Further, input signals CTRL1, CTRL2, ... CTRLk and the address signals are given to the control circuit CONT by inputting data (generated by design support software according to a circuit designed by the user) via a data writing device.

Figure 12:
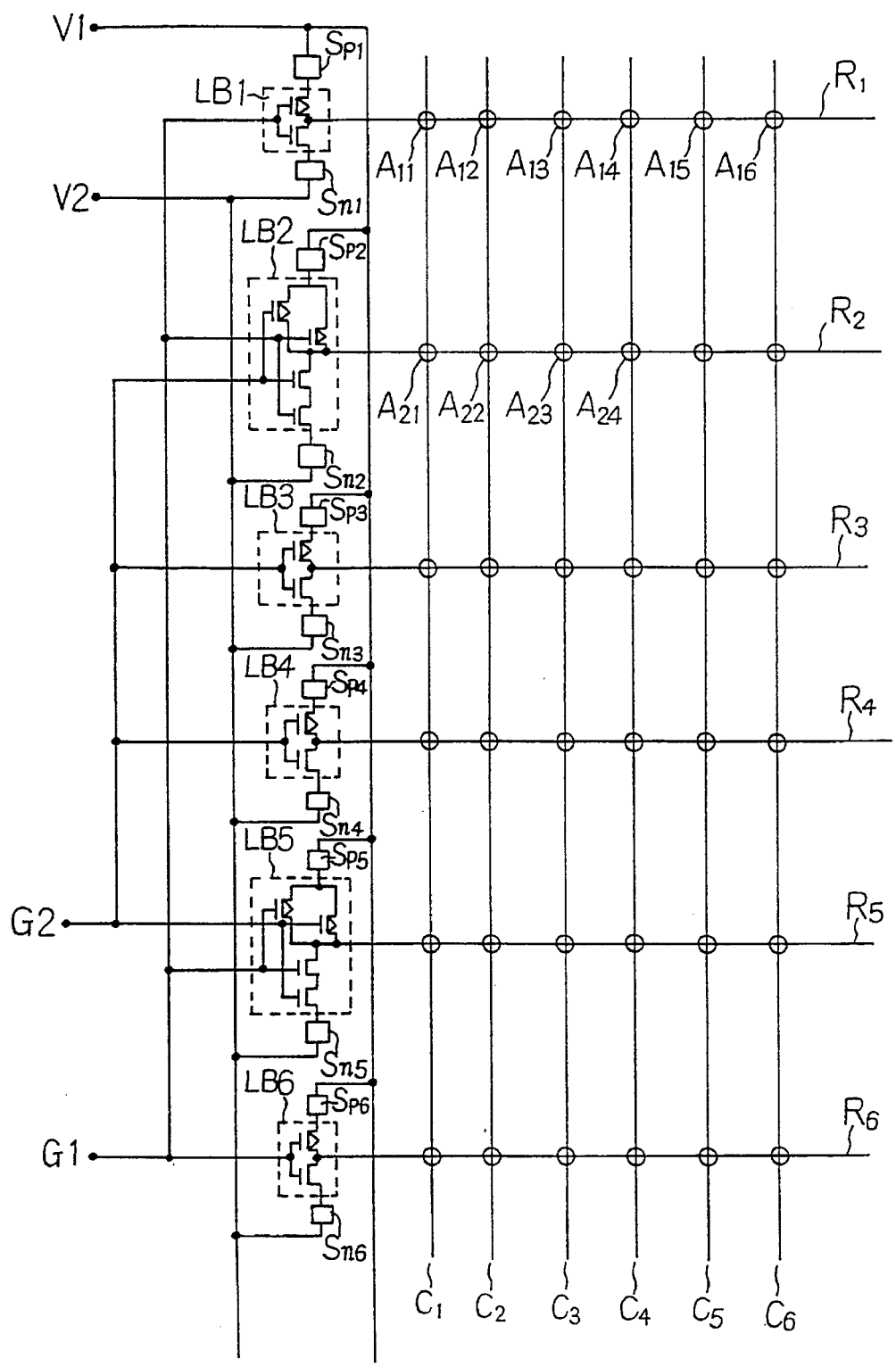
FIG. 12 is a diagram showing a second embodiment of the FPGA according to the present invention.

FIG. 12 shows a second embodiment of the present invention, in which disconnecting elements Sp1 to Sp6 and Sn1 to Sn6 are interposed between the respective logic blocks LB1 to LB6 and the supply voltage lines V1 and V2, respectively. Each of these elements is provided with such characteristics that two terminals thereof can be shorted or disconnected. Further, when the anti-fuses connected to one end of each of the output lines R1 to R6 of the logic blocks are required to be programmed, the supply voltage lines V1 and V2 are disconnected from the logic blocks BL1 to LB6, respectively.

Figure 11:
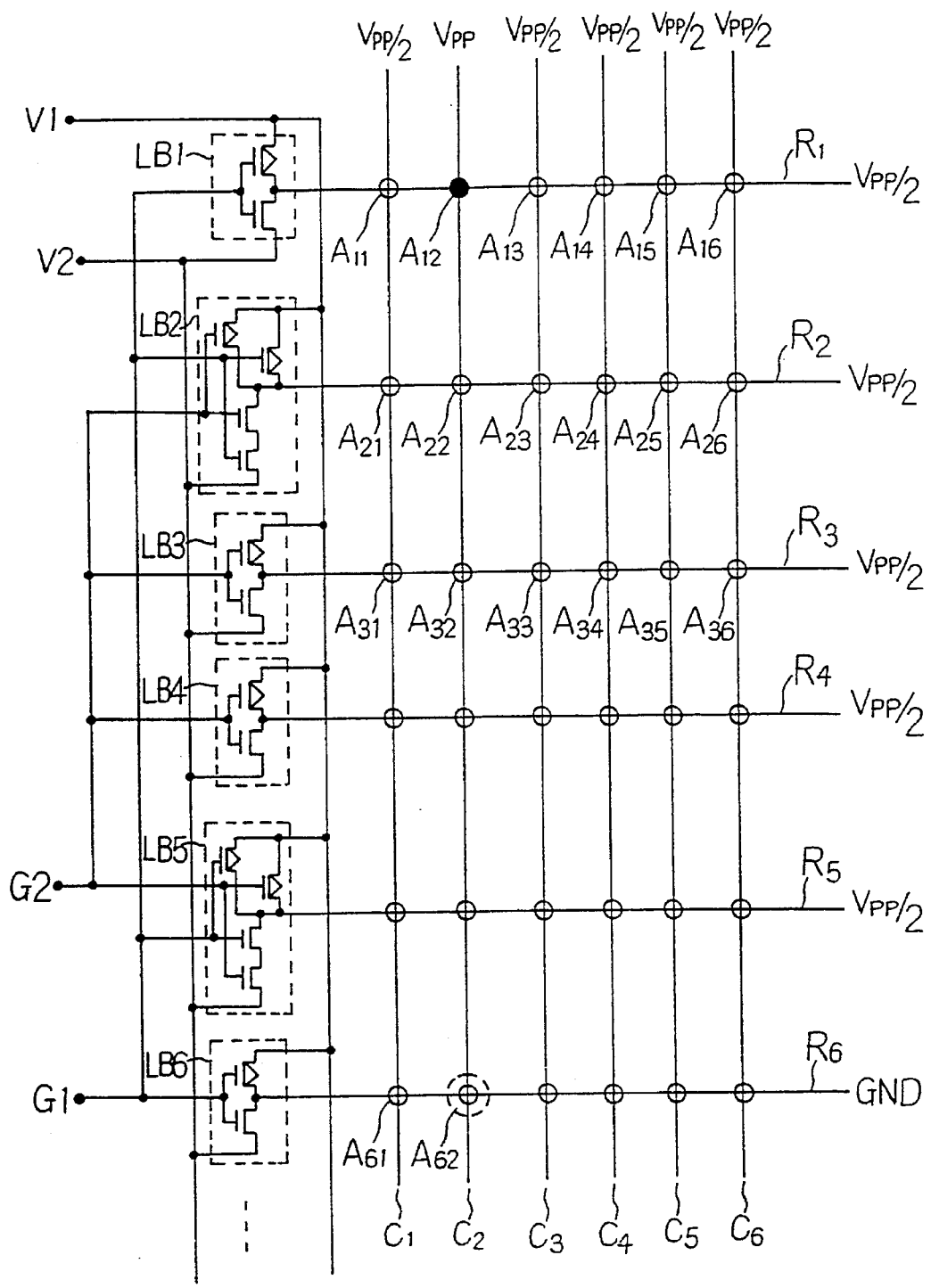
FIG. 11 is a circuit diagram showing the potential application conditions for programming the anti-fuse A62 after the procedure shown in FIG. 10.
Figure 13:
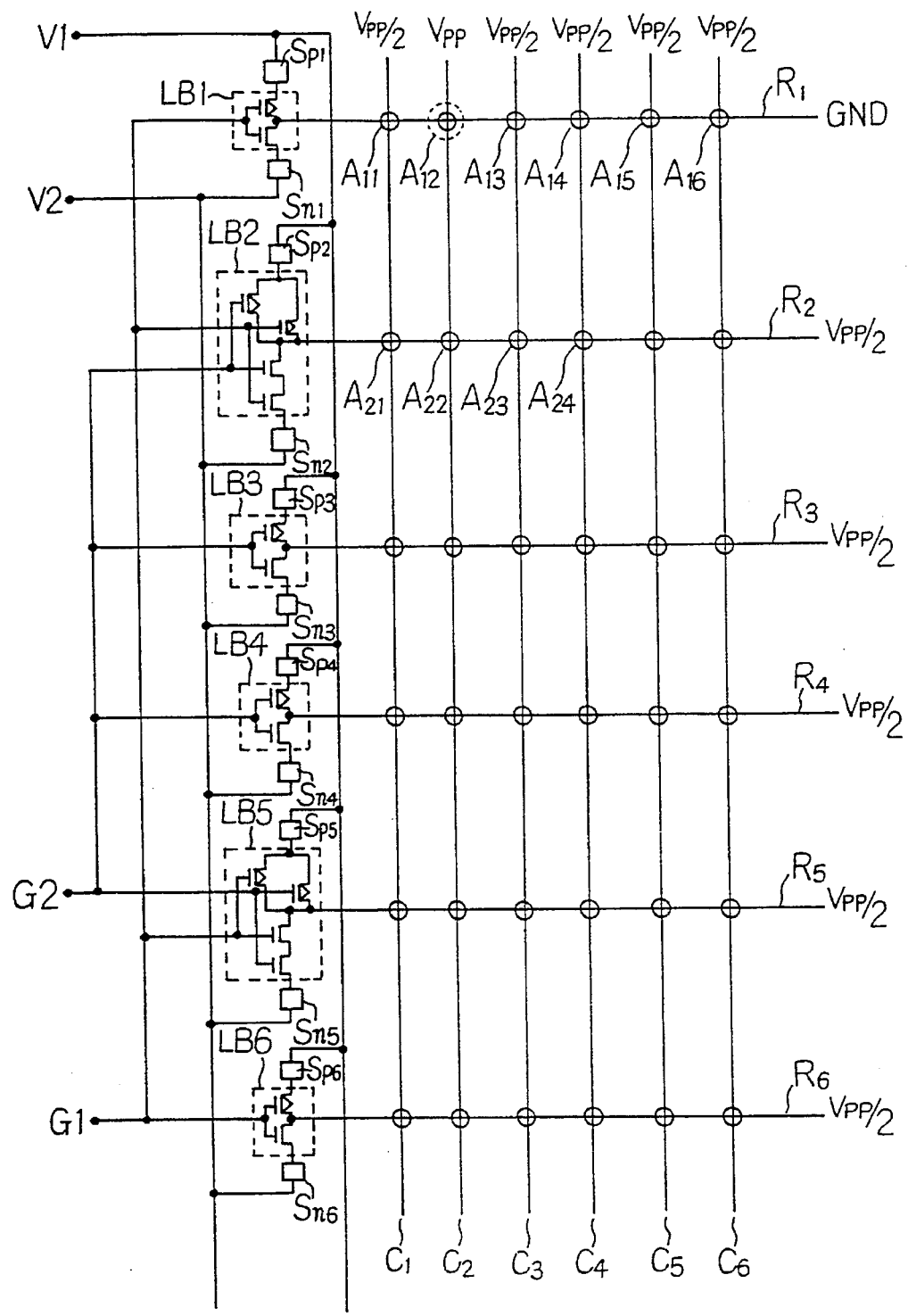
FIG. 13 is a circuit diagram showing the potential application conditions for programming the anti-fuse A12 in the second embodiment shown in FIG. 12.
Figure 14:
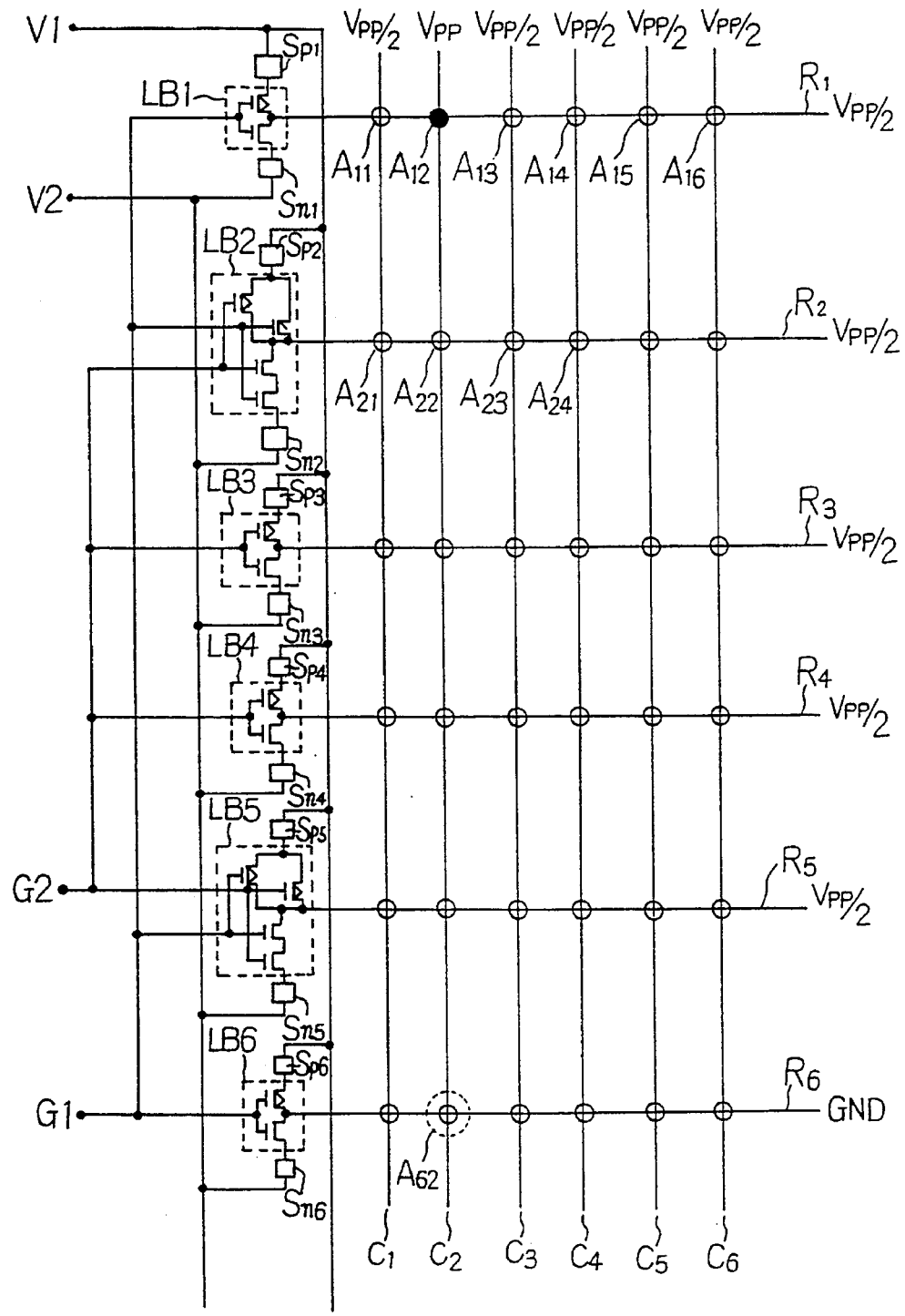
FIG. 14 is a circuit diagram showing the potential application conditions for programming the anti-fuse A62 after the anti-fuse A12 has been programmed in the second embodiment shown in FIG. 12.

FIGS. 13 and 14 show the potential status required when the anti-fuses A12 and A62 are programmed in sequence. First, when the anti-fuse A12 is programmed, the potentials are given as shown in FIG. 13. Thereafter, the potentials as shown in FIG. 14 are applied to program the anti-fuse A62. In these steps, since the output lines R1 to R6 of the respective logic blocks LB1 to LB6 are disconnected from the supply voltage lines V1 and V2 by the disconnecting elements Sp1 to Sp6 and Sn1 to Sn6, it is possible to prevent the phenomenon as shown in FIG. 11 from being produced. That is, it is possible to prevent the program voltage given to the wire C2 from being transmitted to the wire R6, via the already programmed anti-fuse A12, the field effect transistors (which constitute the output sections of the logic blocks, respectively) and the supply voltage lines V1 or V2, with the result that the program voltage is shorted to the ground potential. Consequently, it is possible to reduce the power consumption markedly and further to securely program the anti-fuses without modifying the programming procedure of the selected anti-fuses or without any restriction on the circuits designed by the user. Further, after all the selected anti-fuses have been programmed, when the disconnected (turned-off) elements Sp1 to Sp6 and Sn1 to Sn6 are all scanned so as to be connected (turned-on), it is possible to restore the supply potential V1 and the ground potential V2 so that the circuit operates as desired by the user.

Figure 15:
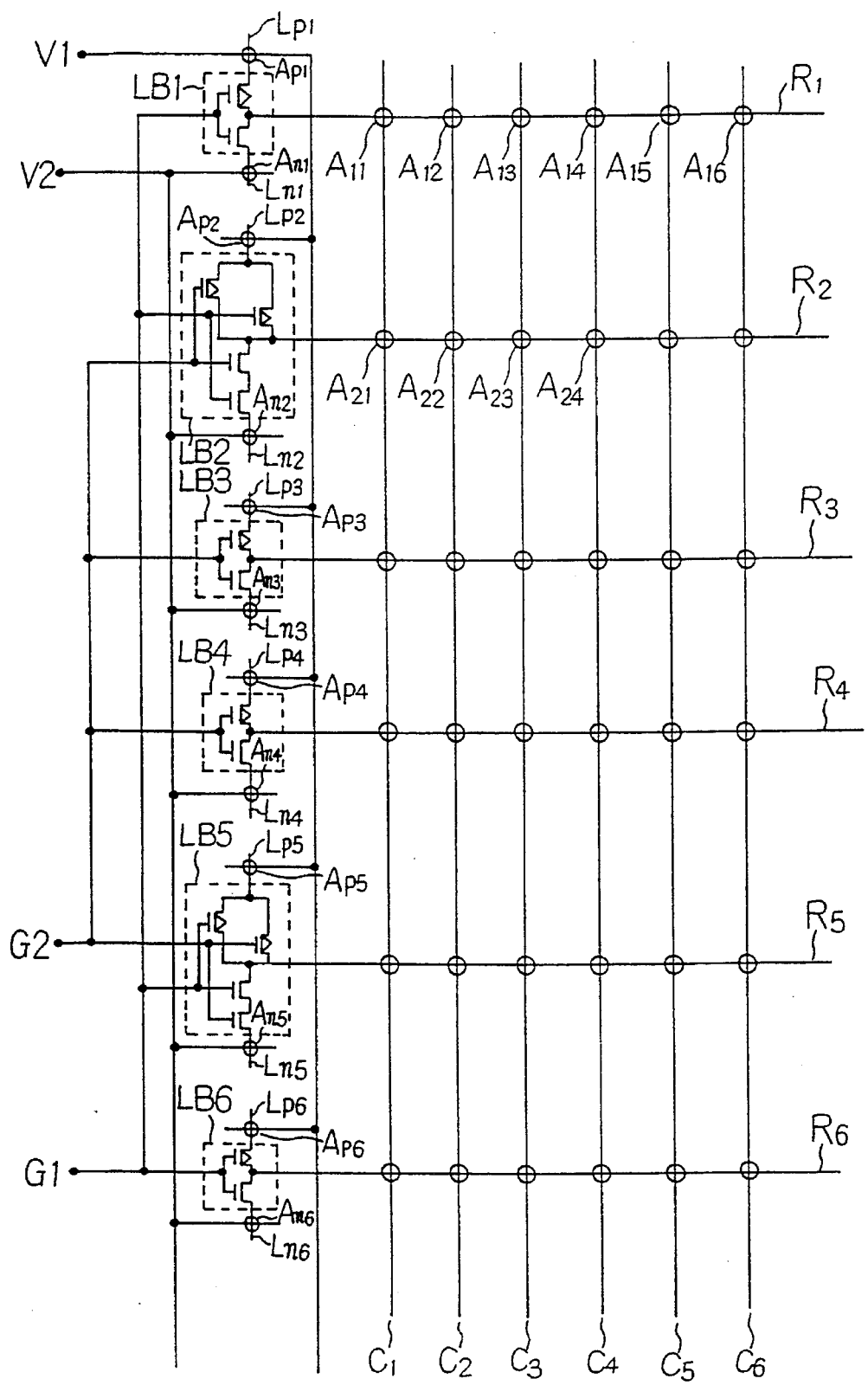
FIG. 15 is a diagram showing a third embodiment of the FPGA according to the present invention.

FIG. 15 shows a third embodiment of the present invention, in which anti-fuses Ap1 to Ap6 and An1 to An6 are used instead of the disconnecting elements Sp1 to Sp6 and Sn1 to Sn6 of the second embodiment. Since the operation and the effect of this third embodiment are quite the same as with the case of the second embodiment, the description thereof is omitted herein. After all the selected anti-fuses connected to the output lines R1 to R6 of the respective logic blocks LB1 to LB6 have been programmed, these anti-fuses Ap1 to Ap6 and An1 to An6 are programmed to connect the supply voltage lines V1 and V2 to the logic blocks, respectively. When the supply voltage V1 and the ground voltage GND are both applied, it is possible to obtained a circuit designed by the user.

Figure 16:
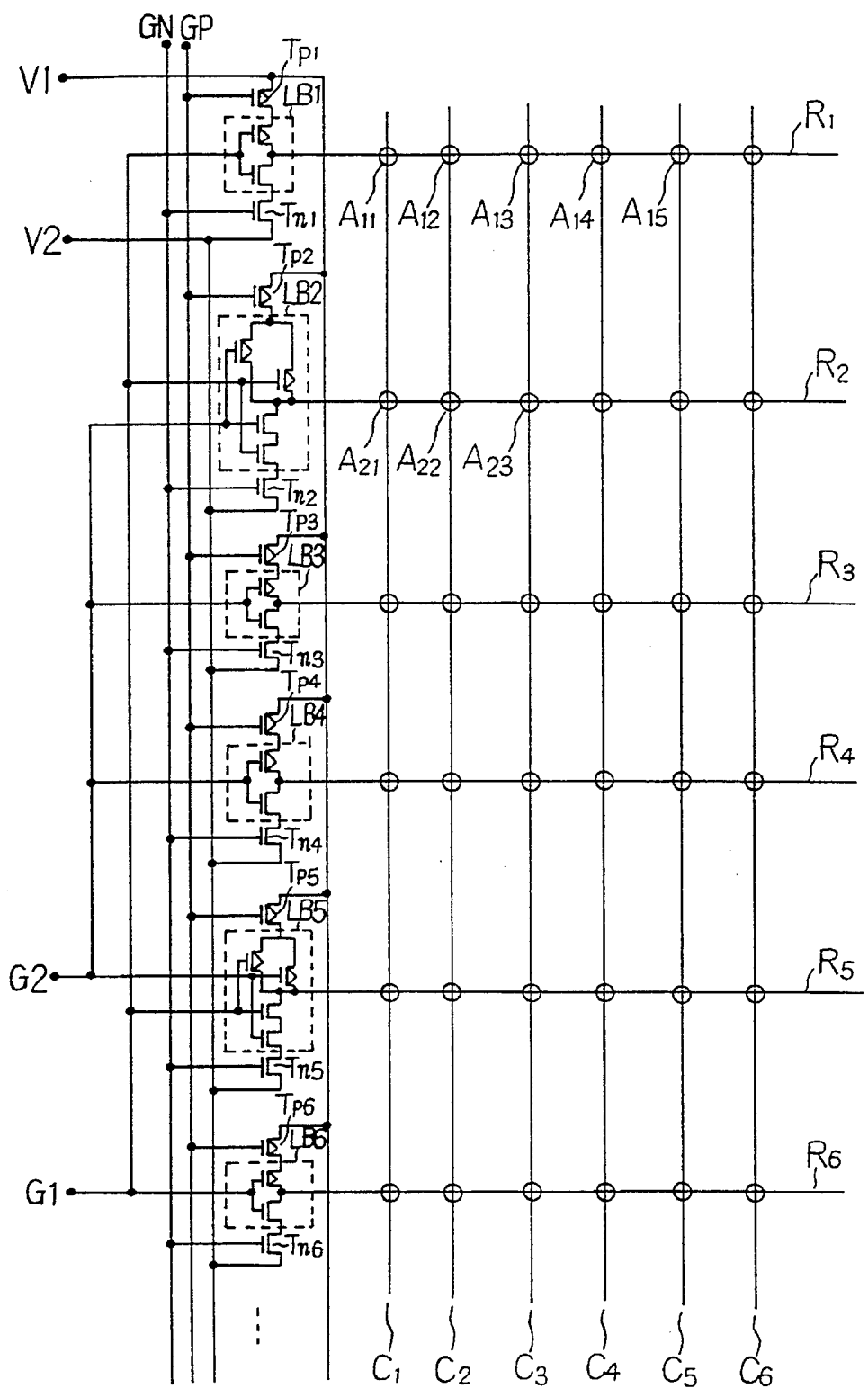
FIG. 16 is a diagram showing a fourth embodiment of the FPGA according to the present invention.

FIG. 16 shows a fourth embodiment of the present invention, in which p-type field effect transistors Tp1 to Tp6 are used instead of the disconnecting elements Sp1 to Sp6 and n-type field effect transistors Tn1 to Tn6 are used instead of the disconnecting elements Sn1 to Sn6. Since the operation and the effect of this fourth embodiment are quite the same as the second embodiment, the description thereof is omitted herein. These field effect transistors are all controllably turned on or off by the potentials applied to terminals GN and GP, respectively. Further, when all the selected anti-fuses connected to the output lines R1 to R6 of the respective logic blocks LB1 to LB6 are being programmed, the terminal GN is kept at the ground potential and the terminal GP is kept at the program potential to turn off the transistors Tp1 to Tp6 and Tn1 to Tn6. After all the selected anti-fuses have been programmed, the supply potential is applied to the terminal GN and the ground potential is applied to the terminal GP to connect the supply voltage lines V1 and V2 to the logic blocks, respectively. When the supply voltage V1 and the ground voltage V2 are both applied, it is possible to obtain a circuit designed by the user.

Figure 17:
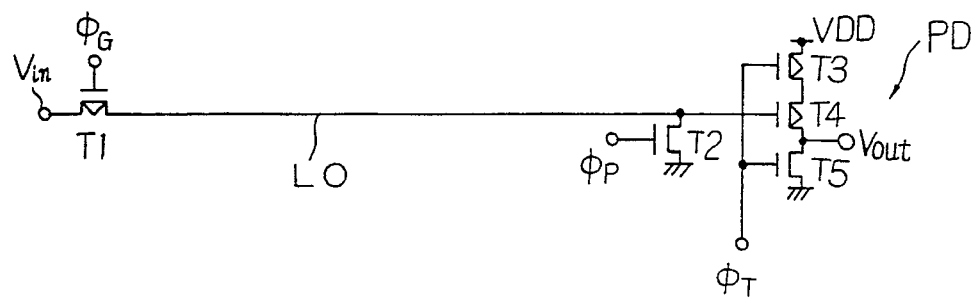
FIG. 17 is a diagram showing a fifth embodiment of the FPGA according to the present invention.

FIG. 17 shows a fifth embodiment of the present invention, which is a test device for discriminating at high speed whether there exist a disconnection or a short circuit in the wiring resources of the FPGA chip. In more detail, a p-type field effect transistor T1 is connected to one end of the wire L0 to be tested in order that a supply voltage VDD can be applied to the drain terminal Vin of the transistor T1 at least when the wire L0 is tested. The gate terminal of this transistor T1 is referred to as $\phi_G$. Further, a supply voltage detecting circuit PD is connected to the other end of the wire L0. The supply voltage detecting circuit PD is formed by connecting p-type field effect transistors T3 and T4 and an n-type field effect transistor T5 as shown in FIG. 17. The other end of the wire L0 to be tested is connected to the gate of the p-type transistor T4. Further, the gates of the transistors T3 and T5 are connected in common, which are referred to as $\phi_T$. Further, another n-type field effect transistor T2 is connected to the wire L0 to be tested, and the drain of the transistor T2 is grounded. The gate terminal of the transistor T2 is referred to as $\phi_P$. Further, the common drain terminals of the transistors T4 and T5 is an output terminal Vout. The potential at this output terminal Vout can be read by use of an external voltmeter, at least when the wire L0 is being tested.

Figure 18:
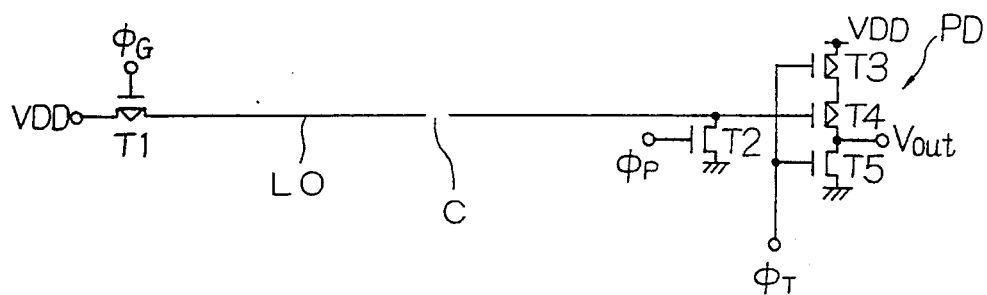
FIG. 18 is a circuit diagram for assistance in explaining the principle of discriminating the wire disconnection in the fifth embodiment of the present invention.
Figure 19:
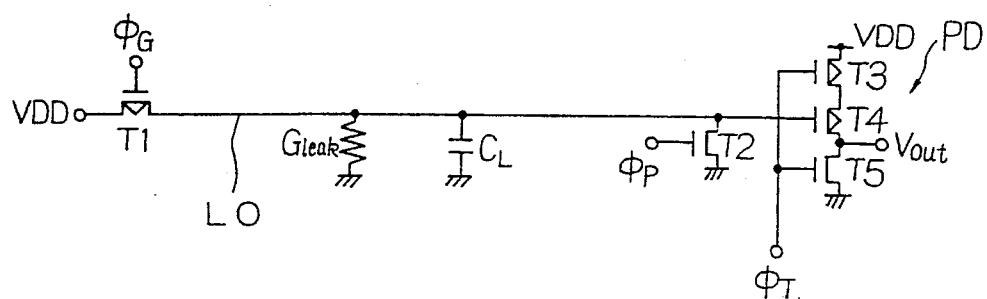
FIG. 19 is a circuit diagram for assistance in explaining the principle of discriminating the current leakage of a wire in the fifth embodiment of the present invention.
Figure 20:
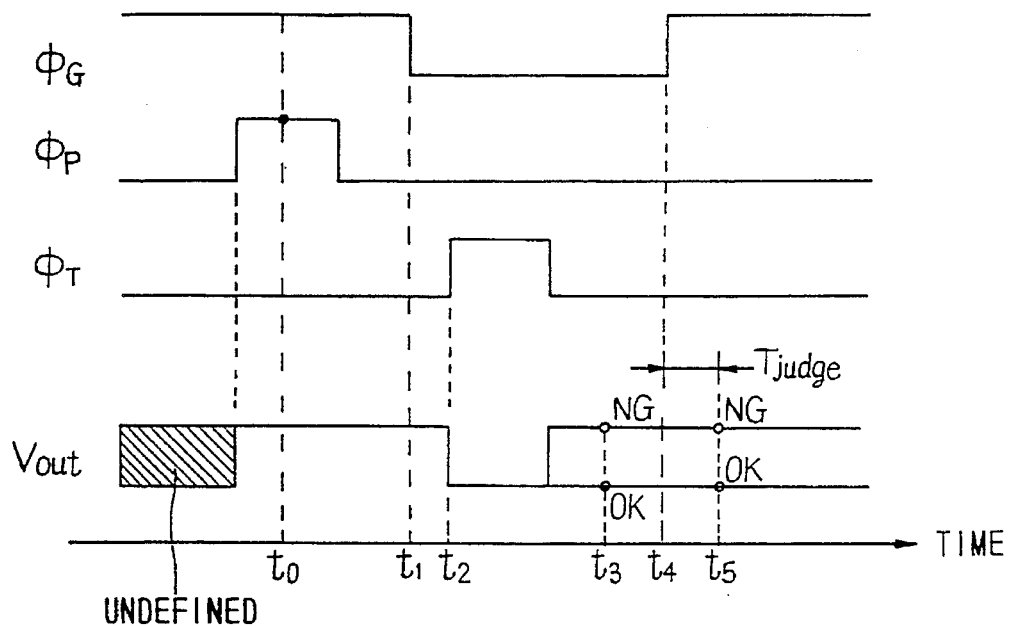
FIG. 20 is a timing chart showing an example of the discrimination in the fifth embodiment of the present invention.

To test the wiring resources with this circuit, the terminal Vin is fixed to the supply voltage VDD, and the respective gate terminals $\phi_G$, $\phi_P$ and $\phi_T$ are connected to a test signal generator. The test signal voltages are varied at timings as shown in FIG. 20. During test, other wiring resources adjacent to or crossing the wire L0 to be tested are all fixed to the ground potential. The voltage at the output terminal Vout is observed at times t3 and t5 as shown in FIG. 20. In case the observed voltage is the supply potential, it is possible to discriminate that there exists a disconnection or a short. In this test circuit, since the voltage can be measured at high speed as compared when the current is measured, it is possible to reduce the test time. The method of discriminating the defective wiring resource will be described hereinbelow with reference to FIGS. 18 and 19. The principle of discriminating whether the wire L0 to be tested is disconnected or not will be described with reference to FIG. 18, and the principle of discriminating whether the wire L0 to be tested is shorted or not will be described with reference to FIG. 19.

First, the case where there exists a disconnection C in the wire L0 to be test is first taken into account. With reference to the timing chart shown in FIG. 20, since the transistor T2 is turned on at time t0, the gate terminal of the transistor T4 is at the ground potential and the transistor T4 is turned on. Thereafter, although the transistor T2 is turned off, the gate terminal potential is kept at the floating status (ground potential) as far as not being connected to the other voltage source through a low resistance. Successively, at time t1, the gate terminal of the transistor T1 is grounded so that the transistor T1 is turned on. At this time, if there exists no disconnection C, the supply potential must reach the gate terminal of the transistor T4. However, in case there exists a disconnection C, the gate terminal potential of the transistor T4 is kept at the ground potential under floating condition so that the transistor T4 is kept turned on. Accordingly, at time t3, since the gate terminal $\phi_T$ is at the ground potential, the transistors T3 and T4 are both turned on. Therefore, the output terminal Vout (once kept at the ground potential under the floating condition at time t2) changes to the supply potential, so that it is possible to discriminate that there exists a disconnection in the wire L0 to be tested. In this connection, when there exists no disconnection C, since the gate potential of the transistor T4 changes to the supply potential at time t1 to turn off the transistor T4, the output terminal Vout is kept at the ground potential (set at time t2) until time t3, so that it is possible to discriminate that there exists no disconnection in the wire L0 to be tested.

Next, the case where there exists a short or a leak between the wire L0 to be test and another wiring resource is taken into account. In this case, the potentials of the wires adjacent to and crossing the wire L0 to be tested are kept at the ground potential. In FIG. 19, the conductance of the shorted or leak is represented by $G_{leak}$ and the floating capacitance of the wire is represented by $C_L$. Here, when the conductance $G_{leak}$ is larger than the channel conductance of the transistor T1, since the gate potential of the transistor T4 is not updated to the supply voltage at time t1 in the above-mentioned disconnection test, the output terminal Vout once set to the ground potential at time t2 is set to the supply potential, so that it is possible to discriminate the defectiveness at time t3. On the other hand, when the conductance $G_{leak}$ is smaller than the channel conductance of the transistor T1, it is impossible to discriminate the short or leak defectiveness in the disconnection test. In this case, however, since the gate terminal $\phi_G$ is set to the supply potential at time t4, the transistor T4 is turned off and therefore the wire L0 to be tested changed to the floating condition. Consequently, since the charge stored in the capacitance $C_L$ is discharged according to the conductance $G_{leak}$, after a time τ has elapsed, the potential of the wire L0 to be tested drops below the threshold value $Vth_{T4}$ of the transistor T4 to turn on the transistor T4. Therefore, when the time τ is shorter than time $T_{judge}$ between times t4 and t5, the output terminal Vout outputs a supply potential at time t5, so that it is possible to discriminate that there exists a short or a leak between the wire L0 to be tested and the other wiring resources. On the other hand, when the time τ is longer than the time $T_{judge}$, since the transistor T4 is kept turned off, the output terminal Vout is kept at the ground potential at time t5, so that it is possible to discriminate that there exists no short or no leak between the wire L0 to be tested and the other wiring resources. The above-mentioned time τ is decided by the formula: $\tau = C_L \times Vth_{T4} / I_{leak}$, where $I_{leak}$ denotes an allowable average leak current. Therefore, in this embodiment, it is necessary to decide the discrimination time $T_{judge}$ according to the allowable leak current. In other words, when the time $T_{judge}$ is long, a smaller leak can be detected; and when the time $T_{judge}$ is short, a larger leak can be detected. More quantitatively, if $T_{judge} = C_L \times Vth_{T4} / I_{leak}$, it is possible to detect a leak more than $I_{leak}$.

Figure 21:
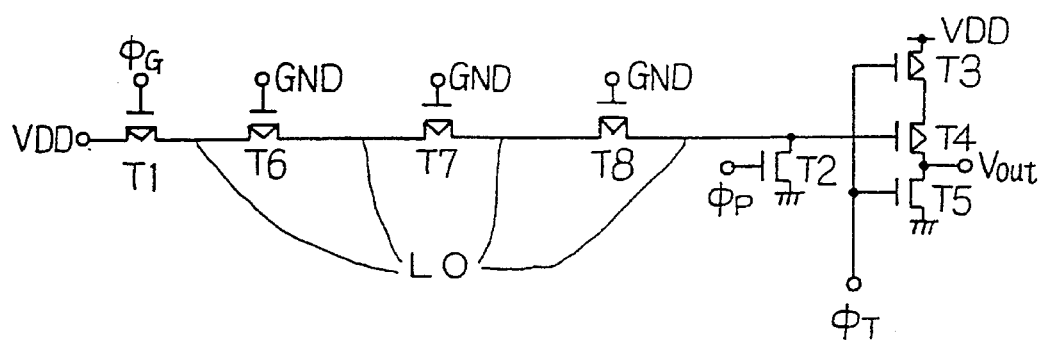
FIG. 21 is a diagram showing a sixth embodiment of the FPGA according to the present invention.

FIG. 21 shows a sixth embodiment of the present invention, which is a test device for discriminating at high speed whether there exist a disconnection or a short in the wiring resources of the FPGA LSI. This embodiment is different from the fifth embodiment in that the wire L0 to be tested is a plurality of wiring resources connected in series through testing field effect transistors T6, T7 and T8. In this embodiment, at least during the test, the gate potentials of the transistors T6, T7 and T8 must be kept at the ground potential to turn on these transistors. The detecting principle is the same as with the case of the fifth embodiment, and therefore the description thereof is omitted herein.

The present invention can be modified in various ways other than the above-mentioned embodiments. First, in the first embodiment, the ground potential is applied to the wires arranged in the row direction (crossing the selected anti-fuses) and the program potential is applied to the wires arranged in the column direction. In contrast with this, it is possible to apply the program potential to the wires arranged in the row direction and the ground potential to the wires arranged in the column direction. The same modification can be applied to the second and third embodiments. Further, in the fifth embodiment, the conductive types of the field effect transistors shown in FIG. 17 can be reversed. That is, it is possible to use n-type field effect transistors as the transistors T1, T3 and t4 and p-type field effect transistors as the transistors T2 and T5. In this case, however, the supply potential is replaced with the ground potential and the ground potential is replaced with the supply potential. In addition, the input potential shown in FIG. 20 must be reversed by replacing the supply potential with the ground potential or vice versa. The same can be applied to the sixth embodiment.

Further, the present invention can be modified in various ways without departing the scope of the present invention.

As described above, in the FPGA using the anti-fuses as the switching elements according to the present invention, it is possible to reduce the power consumption when the anti-fuses are being programmed. In addition, the anti-fuses can be programmed without placing any restriction on the circuits to be designed by the user and on the programming procedure. Further, since the wiring defectiveness (e.g., disconnection and short of the wiring resources) of the FPGA LSI can be tested at high speed, it is possible to shorten the test time markedly.

What is claimed is:

1. A field programmable gate array, comprising:

a first wiring group composed of a plurality of first wirings;

a second wiring group composed of a plurality of second wirings;

a plurality of programmable elements arranged into an array pattern at intersections between the first wirings and the second wirings, each of said programmable elements being connected to one of the first wirings at one end thereof and to one of the second wirings at the other end thereof and being programmed by a programming voltage applied between the first wiring and second wiring to switch connection between the first and second wirings to disconnection between the two wirings or vice versa; and voltage supplying means for applying programming voltages to the first and second wirings between which a programmable element to be programmed is connected and intermediate voltages to the first and second wirings between which a programmable element not to be programmed is connected, the intermediate voltage being lower than the programming voltage to such an extent as not to affect a programming state of said programmable elements, wherein during programming and subsequent to said voltage supplying means applying intermediate voltages to the first and second wirings between which said programmable element not to be programmed is connected, said voltage supplying means isolates the first and second wirings between which said programmable element not to be programmed is connected from a voltage source within the voltage supplying means so that a voltage present on the first and second wirings between which said programmable element not to be programmed is connected floats with respect to the voltage source.

2. The field programmable gate array of claim 1, wherein said voltage supplying means selectively supplies the programming voltage and the intermediate voltage to the first wirings, and selectively supplies a ground voltage and the intermediate voltage to the second wirings, respectively, at least during an initial stage of a programming operation.

3. A field programmable gate array, comprising:

a first wiring group composed of a plurality of first wirings;

a second wiring group composed of a plurality of second wirings;

a plurality of switching means, each of said plurality of switching means being arranged at an intersection between each of the first wirings and each of the second wirings, one end of each of said switching means being connected to each of the first wirings and the other end of said switching means being connected to each of the second wirings to selectively connect or disconnect the first wiring to or from the second wiring on the basis of a programming voltage applied between both ends of each of said switching means;

a plurality of circuit blocks each having at least one input terminal and at least one output terminal, at least one of the output terminals thereof being connected to any of the first wirings; and a plurality of disconnecting means each for selectively disconnecting the output terminal of each of said circuit blocks from a supply voltage line and a ground line of the circuit block at least during programming of the switching means, irrespective of an input terminal voltage.

4. The field programmable gate array of claim 3, wherein said disconnecting means has at least either a first switching element or a second switching element, said first switching element selectively connecting or disconnecting the output terminal to or from the supply voltage line of each of the circuit blocks and said second switching element selectively connecting or disconnecting the output terminal to or from the ground line of each of the circuit blocks.

5. The field programmable gate array of claim 3, wherein said disconnecting means are transistors.

6. A field programmable gate array, comprising:

a voltage supplying means temporarily connected to one end of a wiring to be tested, for supplying a high voltage or a low voltage to said wiring only during a test period for said wiring:

a precharging means connected to the wiring to be tested, for supplying a voltage different from the voltage supplied to said wiring by said voltage supplying means only in a period before said test period; and discriminating means connected to the other end of the wiring to be tested, for discriminating whether a voltage at the other end of the wiring is the same as the voltage applied at said one end of said wiring by said first voltage supplying means during the test period.

7. The field programmable gate array of claim 6, wherein when said voltage supplying means outputs a high voltage, said discriminating means outputs a high voltage only when the voltage of the wiring to be tested drops from the high voltage below a threshold voltage of a p-type field effect transistor and otherwise outputs a low voltage; and when said voltage supplying means outputs a low voltage, said discriminating means outputs a low voltage only when the voltage of the wiring to be tested rises from the low voltage beyond a threshold voltage of an n-type field effect transistor and otherwise outputs a high voltage.

8. The field programmable gate array of claim 6, wherein at least during testing, a voltage different from said voltage provided by said voltage supplying means temporarily connected to one end of the wiring to be tested is applied to wirings other than the wiring to be tested which are at least adjacent to or intersect the wiring to be tested.

* * * * *